United States Patent
Kanskar et al.

(10) Patent No.: US 10,862,265 B2
(45) Date of Patent: *Dec. 8, 2020

(54) LOW SIZE AND WEIGHT, HIGH POWER FIBER LASER PUMP

(71) Applicant: NLIGHT, INC., Vancouver, WA (US)

(72) Inventors: Manoj Kanskar, Portland, OR (US); Johannes Boelen, Vaudreuil-Dorion (CA)

(73) Assignee: NLIGHT, INC., Vancouver, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/154,510

(22) Filed: Oct. 8, 2018

(65) Prior Publication Data

US 2019/0052050 A1   Feb. 14, 2019

Related U.S. Application Data

(63) Continuation of application No. 15/498,422, filed on Apr. 26, 2017, now Pat. No. 10,109,978.
(Continued)

(51) Int. Cl.
*H01S 5/024*     (2006.01)
*H01S 5/022*     (2006.01)
(Continued)

(52) U.S. Cl.
CPC ...... *H01S 5/02423* (2013.01); *H01S 5/02284* (2013.01); *H01S 5/02288* (2013.01);
(Continued)

(58) Field of Classification Search
CPC ............. H01S 5/02423; H01S 5/02407; H01S 5/02476; H01S 5/02469; H01S 5/02284;
(Continued)

(56) References Cited

U.S. PATENT DOCUMENTS 6,483,705 B2   11/2002   Snyder et al.
7,058,101 B2    6/2006   Treusch et al.
(Continued)

FOREIGN PATENT DOCUMENTS

CN      1507767 A       6/2004
CN    203377483 U       1/2014
(Continued)

OTHER PUBLICATIONS

International Search Report and Written Opinion for PCT/US2017/029720, dated Aug. 4, 2017, 8 pages.
(Continued)

*Primary Examiner* — Armando Rodriguez
(74) *Attorney, Agent, or Firm* — Michelle Craig

(57) ABSTRACT

A device for cooling a laser diode pump comprising a Low Size Weight Power Efficient (SWAP) Laser Diode (LSLD) assembly, including a laser diode coupled to a submount on a first surface, the submount comprising a first thermally conductive material and a heatsink coupled to a second surface of the submount, wherein the heatsink comprises a second thermally conductive material, the heatsink comprising one or more members formed on a side opposite the coupled submount. The device further comprising a housing coupled to the LSLD assembly, the housing comprising a carrier structure having an aperture configured to support the LSLD assembly on a first side and having a plurality of channels on a second side, a bottom segment configured to couple to the carrier segment to create an enclosure around the channels between a top side of the bottom segment and the second side of the carrier structure, an inlet and outlet formed in the housing for transporting a coolant into and out of the channels in the enclosure, wherein the members are disposed within the enclosure so as to expose the members to the coolant.

18 Claims, 16 Drawing Sheets

Related U.S. Application Data

(60) Provisional application No. 62/327,971, filed on Apr. 26, 2016, provisional application No. 62/458,569, filed on Feb. 13, 2017.

(51) Int. Cl.
  H01S 5/40 (2006.01)
  H01S 3/094 (2006.01)
  H01S 3/0941 (2006.01)

(52) U.S. Cl.
  CPC ........ H01S 5/02469 (2013.01); H01S 5/4012 (2013.01); H01S 5/4025 (2013.01); *H01S 3/09415* (2013.01); *H01S 3/094003* (2013.01); *H01S 5/02208* (2013.01); *H01S 5/02236* (2013.01); *H01S 5/02438* (2013.01)

(58) Field of Classification Search
  CPC .. H01S 5/0288; H01S 5/02236; H01S 5/4012; H01S 5/4025
  See application file for complete search history.

(56) References Cited

U.S. PATENT DOCUMENTS

| | | | |
|---|---|---|---|
| 7,599,414 B2 | 10/2009 | Miyajima et al. | |
| 7,732,918 B2* | 6/2010 | Dangelo | F28D 15/046 165/80.3 |
| 9,001,856 B1 | 4/2015 | Govorkov et al. | |
| 9,077,142 B2 | 7/2015 | Xu | |
| 10,109,978 B2* | 10/2018 | Kanskar | H01S 5/02284 |
| 2005/0063433 A1 | 3/2005 | Treusch | |
| 2010/0118902 A1* | 5/2010 | Wu | H01S 5/024 372/36 |
| 2010/0158058 A1 | 6/2010 | Kress | |
| 2011/0286482 A1* | 11/2011 | Deri | H01S 5/02469 372/35 |
| 2013/0032311 A1 | 2/2013 | Bhunia et al. | |
| 2014/0328360 A1 | 11/2014 | Ertel et al. | |
| 2016/0072254 A1 | 3/2016 | Suzuki | |

FOREIGN PATENT DOCUMENTS

| | | |
|---|---|---|
| WO | 2017189779 | 11/2017 |
| WO | 2018200863 | 11/2018 |

OTHER PUBLICATIONS

USPTO; International Search Report and Written Opinion for PCT/US2018/029637, dated Aug. 10, 2018; 7 pages.

* cited by examiner

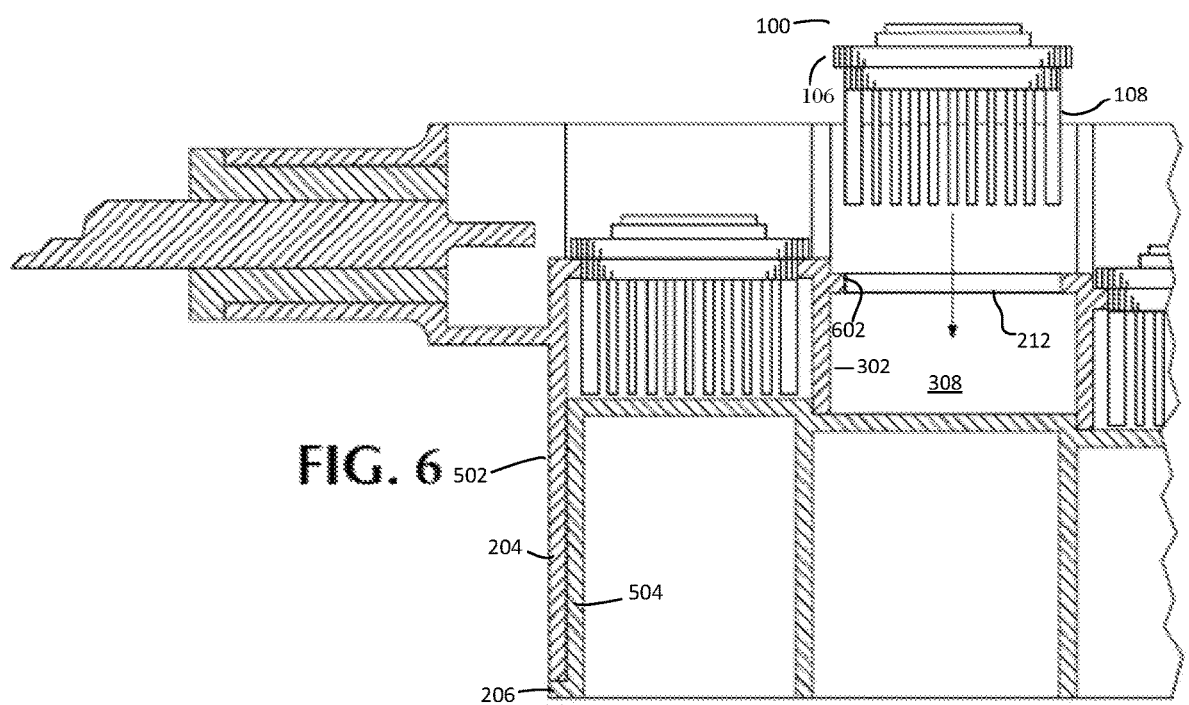

LOW SIZE AND WEIGHT, HIGH POWER FIBER LASER PUMP

CROSS-REFERENCE TO RELATED APPLICATIONS

This application is a continuation of and claims priority from U.S. patent application Ser. No. 15/498,422, filed Apr. 26, 2017, now issued as U.S. patent Ser. No. 10/109,978, which is a non-provisional of and claims priority from US provisional patent application U.S. Ser. No. 62/327,971 filed on Apr. 26, 2016 and US provisional patent application U.S. Ser. No. 62/458,569 filed on Feb. 13, 2017.

TECHNICAL FIELD

This invention relates generally to thermal management of laser diode pumps.

BACKGROUND

Most fiber-coupled laser diode pumps have been developed for large volume industrial applications where the primary metric is price-per-bright-watts and reliability. In conventional high-power fiber laser technology a significant portion of the weight and volume of the total fiber laser system is in the high powered diode pumps where much of that weight and volume is devoted to waste heat removal. For example, high-powered laser diode pumps are commonly cooled with chilling plates made of highly thermally conductive material such as copper (Cu). This adds significant excess mass and volume to a laser system.

However, in mobile laser applications the key metrics also include volume, weight, and electrical to optical power conversion efficiency (PCE). Moreover, industrial diode lasers are approximately 1 kg/kW and volumes are greater than two times what would be acceptable for High Energy Laser (HEL) applications. Furthermore, industrial diode lasers are at approximately 50% electrical-to-optical PCE hereas, HEL applications require PCE 55%. What is needed is laser diode pumps that are optimized for size, weight and power efficiency in addition to price-per-bright-watts and reliability.

SUMMARY

Disclosed herein is a Low Size Weight and Power (SWAP) efficient Laser Diode pump design encompassing a shift from a dense but high thermal-conductivity solid material (e.g., copper) to lighter materials while keeping the opto-mechanical design and topology of a conventional industrial laser diode pump package to improve manufacturing outcomes and reduce manufacturing costs. Additionally, disclosed are methods of packing multiple laser diode pump packages together in a compact manner to demonstrate power-scaling capability while maintaining low SWAP and high efficiency of the disclosed laser diode pump. Although, in the examples provided herein a particular pump architecture is used to demonstrate the Low SWAP Laser Diode (LSLD) pump design, the concept described may be applied to a variety of pump architectures and claimed subject matter is not limited in this regard. In an example, the disclosed LSLD pump design uses, at least, three-times lower density materials for housing, lid and thermally non-critical parts. The housing material is also stiff enough that with the addition of new structural features a rigid support mechanism is in place to maintain optical alignment while keeping mass at a minimum. Instead of using a solid base for the package which then gets thermally coupled to yet another chilling plate the disclosed LSLD pump incorporates high surface-area fins (or similar structures) attached to the laser diode submount and located inside a hollowed-out housing to improve the thermal conductance by three times while reducing total mass to achieve 0.5 kg/kW specific mass.

Multiple LSLD pumps may be coupled together for higher energy applications. A manifold shared by two or more LSLD pumps may be used to introduce coolant to remove excess heat dissipated by the fins of the two or more LSLD pumps. The manifold may be made of very lightweight materials such as Polyetheretherketone (PEEK) for example, his removes the need for chilling plates which typically adds excess mass and volume to laser systems. The disclosed LSLD Pump may have a 4× smaller footprint, 10× smaller mass and 10% higher efficiency than comparable products available on the market.

BRIEF DESCRIPTION OF THE DRAWINGS

The accompanying drawings, wherein like reference numerals represent like elements, are incorporated in and constitute a part of this specification and, together with the description, explain the advantages and principles of the presently disclosed technology. In the drawings.

FIG. 6 is an exploded cross-sectional side view of an LSLD pump;

DETAILED DESCRIPTION

Figure 1:
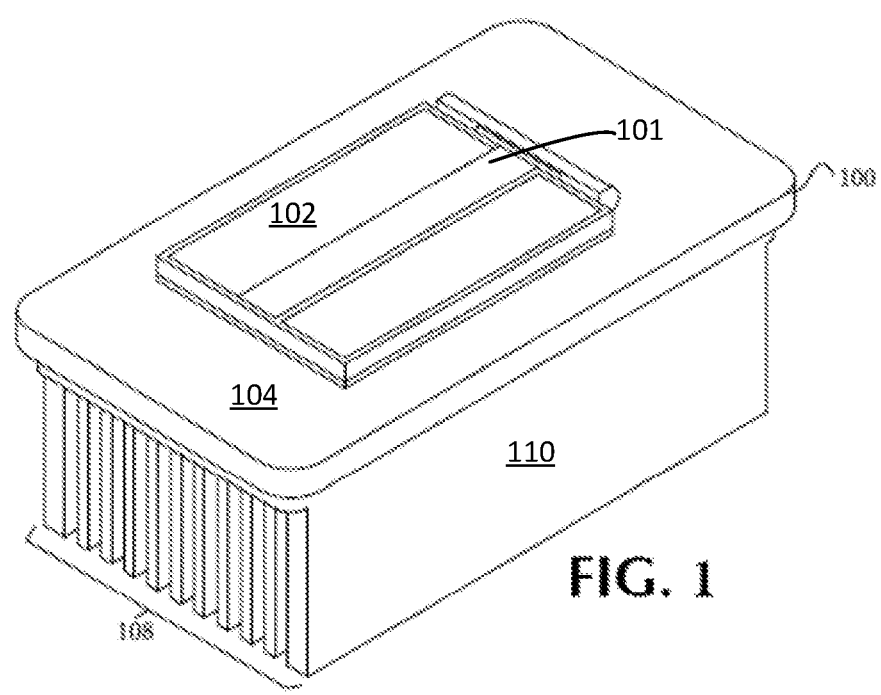
FIG. 1 illustrates an example of a low SWAP laser diode (LSLD) assembly.

As used herein throughout this disclosure and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Also, the terms "modify" and "adjust" are used interchangeably to mean "alter."

The systems, apparatus, and methods described herein should not be construed as limiting in any way. Instead, the present disclosure is directed toward all novel and nonobvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Throughout the following disclosure lists giving examples of various elements, materials, structures, features, or the like or any combination thereof are provided. While these lists are representative of the types of elements, materials, structures, features, or the like or any combination thereof various examples may comprise, the lists are by no means exhaustive and are merely intended to elucidate the disclosed technology and claimed subject matter is not limited in this regard.

FIG. 1 illustrates an example of a low SWAP laser diode (LSLD) assembly 100. LSLD assembly 100 comprises a laser diode 101 configured to generate a laser beam. Laser diode 101 is coupled to submount 102 in a "Chip on Submount" (COS) formation. Submount 102 may be made of a variety of materials such as silicon carbide (SiC), chemical vapor deposition (CVD) diamond, copper (Cu), aluminum nitride (AlN), cubic boron nitride (c-BN), graphite, graphene, graphene-composites, carbon nanotubes, carbon nanotube composites, diamond or encapsulated pyrolytic graphite, or the like or any combinations thereof. It can be shown that there is improvement in power and efficiency of laser diode 101 mounted on a SiC submount vs an AlN submount. Furthermore, a comparison of the junction temperature of laser diode 101 on a SiC submount vs CVD-diamond submount shows CVD-diamond submount performs 25% better in thermal resistance.

In an example, submount 102 is coupled to a heatsink 104 configured to transfer heat generated by a laser diode 101 to heatsink 104. Heatsink 104 may comprise any of a variety of materials such as aluminum silicon carbide (AlSiC), pyrolytic graphite, copper (Cu), aluminum (Al), or the like or any combinations thereof. Heatsink 104 may be fabricated out of something completely different from conventional materials noted above.

Example heatsink 104 includes a plurality of members 108. As depicted in FIG. 1, members 108 comprise fins 110. In other examples, members 108 can comprise any of a variety of structures having a high surface-to-volume ratio configured for efficient heat transfer. Such structures include fins, posts, pegs, structures having textured surfaces (e.g., dimpled surfaces), or porous structures (e.g., graphite foam or micro-porous copper (Cu)), structures constructed using additive manufacturing to optimize surface-to-volume ratio with functional optimization, or the like or any combinations thereof. It is possible to reduce a conventional copper heatsink mass by about 30%, for example, from a current 1.94 g to 1.40 g per heatsink. This may amount to 30% reduction in heatsink mass and 0.27 g/W specific mass for the total package. Additionally the thermal transfer coefficient may reduce to, at least, double resulting in about 1% improvement in efficiency.

In an example, heatsink 104 may be fabricated by a variety of techniques known to those of skill in the art. One such technique might be computer numerical control (CNC) machining, for example. In another example, heatsink 104 may be fabricated by skiving or micro-skiving which allows introducing a large surface area to increase a thermal transfer coefficient. In an example, wherein the members 108 comprise fins a range of thicknesses, gaps and fin heights to optimize the thermal transfer coefficient may be selected depending on the desired output power level and operating efficiency.

Figure 2A:
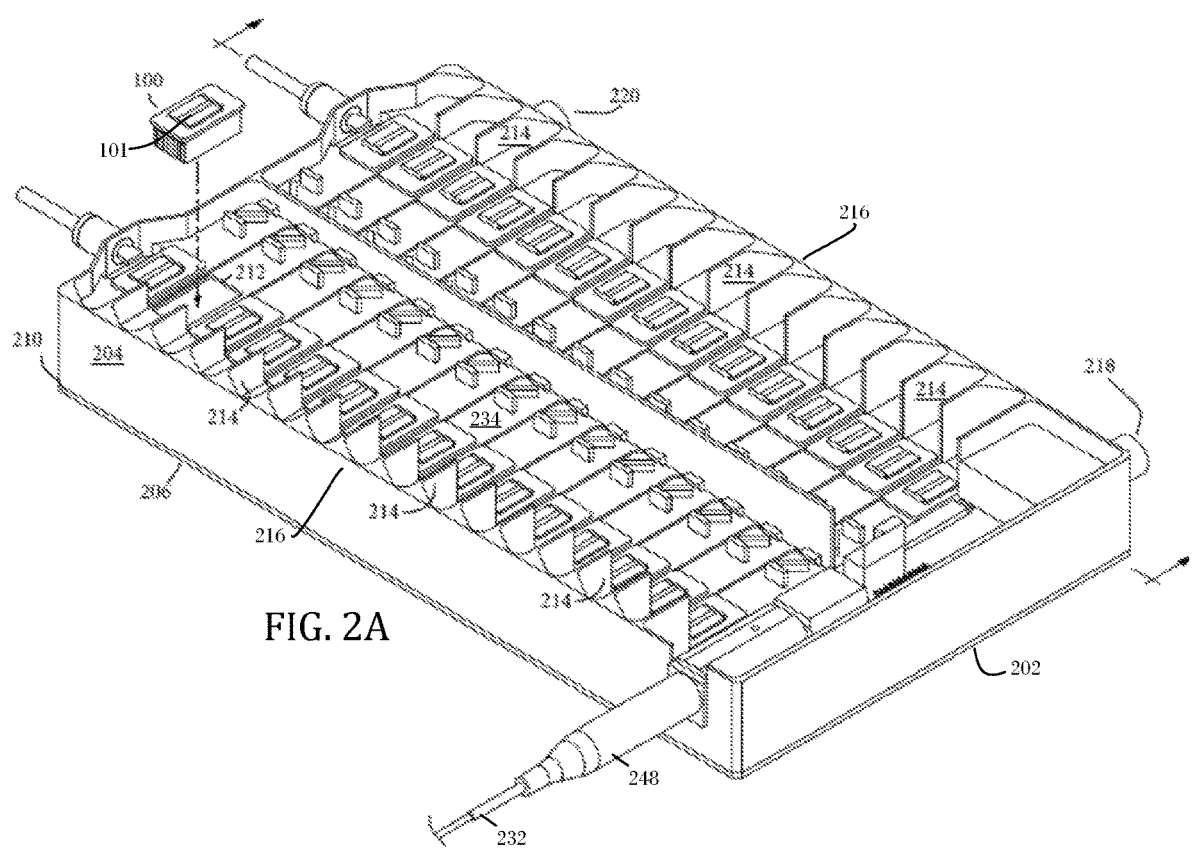
FIG. 2A illustrates an example of a LSLD pump 200.

FIG. 2A illustrates an example of a low SWAP laser diode (LSLD) pump 200. Diode pump 200 comprises a housing 202 having a carrier segment 204 configured to support one or more LSLD assemblies 100. Housing 202 may comprise a variety of rigid and lightweight materials for example aluminum (Al), aluminum silicon carbide (AlSiC), magnesium alloys, different forms of carbon, beryllium alloys (e.g., BeO and/or BeAl), or the like or combination thereof. Carrier structure 204 may secure the one or more LSLD assemblies 100 in apertures 212 which are formed to mate to and support corresponding LSLD assemblies 100. In an example, laser diodes 101 reside above surface 234 of carrier structure 204.

Apertures 212 are configured to securely hold one or more members 108 of one or more LSLD assemblies 100 in channels (see FIG. 3B) formed in a backside of carrier structure 204. The channels are formed so that coolant can flow through them. LSLD assemblies 100 generate significant amounts of heat during operation. As coolant flows through the channels and across the members 108 it can transfer significant amounts of heat away from LSLD assemblies 100. Because heat is transferred very efficiently to members 108 in contact with coolant flowing through the channels, LSLD pump 200 may operate more efficiently, with lower mass flow and lower pressure drop than a conventional laser diode pump having only a solid thermally conductive heatsink that is not in contact with a flowing coolant.

In an example, each LSLD assembly 100 is attached to an inner surface of a corresponding aperture 212 by gluing, soldering, brazing, welding or the like or a combination thereof. Surface 234 may be a flat plate or may comprise a vertical stair step structure as shown in FIG. 2A. With such a stair step arrangement, each aperture 212 into which the LSLD assemblies 100 are disposed can be on a separate stair so that the beams emanating from the LSLD assemblies 100 can be spatially separated from one another. Thus, LSLD assemblies 100 may be disposed relative to one another in a stepwise fashion. In another example, a plurality of cavities 212 may reside on a single stairstep in order to support a plurality of laser diodes 100 at each stairstep level.

In an example, bottom segment 206 may form a sealed chamber when coupled with carrier structure 204. Bottom segment 206 and carrier structure 204 may be coupled at lip 210 (and/or other locations) by a variety of methods such as welding, brazing, gluing, or friction or the like, or any combination thereof.

Figure 2B:
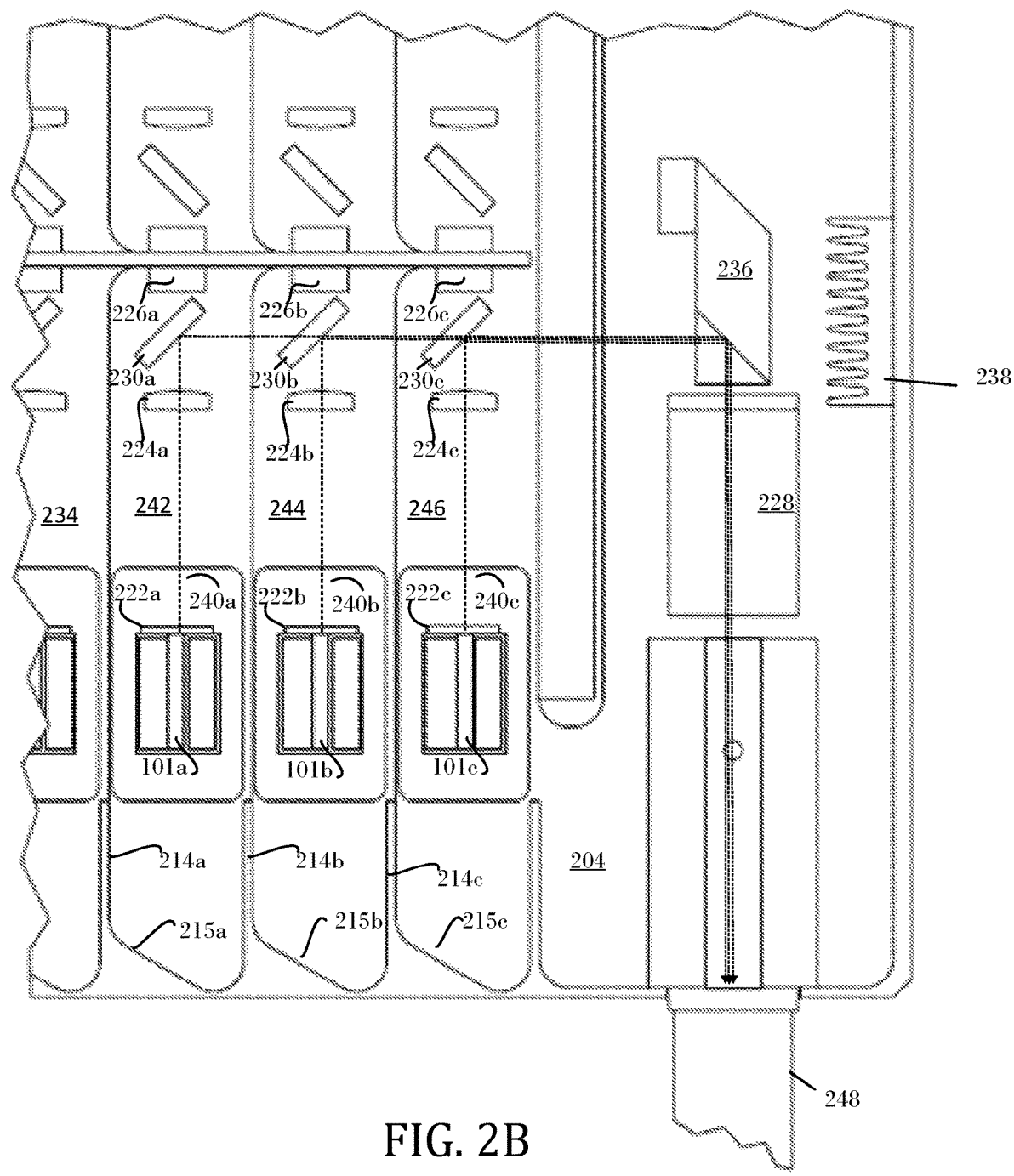
FIG. 2B is a partial section view of an example carrier structure of an LSLD pump magnified to show an example of optical components that may be designed into an LSLD pump.

One or more laser diodes 101 are carefully aligned with a variety of optical components within housing 202. FIG. 2B illustrates a partial section view of carrier structure 204 enlarged to show an example of optical components that may be designed into LSLD pump 200. The following example includes laser diodes and corresponding optical components stacked in the vertical axis on stair steps. The number of laser beams and stair steps chosen depends on the desired output power level and operating efficiency of the LSLD pump 200. The partial section view shown in FIG. 2B shows three laser diodes and stair steps. However, any reasonable number of laser diodes may be included in LSLD pump 200 and claimed subject matter is not so limited. Such optical components may comprise fast axis collimating (FAC) lenses 222a-c, slow axis collimating (SAC) lenses 224a-c, angled reflective surfaces 226a-c, turning mirrors 230a-c, a polarization multiplexer (P-MUX) 236, a meniscus fast axis telescope (mFAT) 228, ferrule 248 and light absorbing element 238.

In an example, each fast axis collimating (FAC) lens 222a-c is for collimating respective laser beams 240a-c generated by laser diodes 101a-c in the fast axis. Slow axis collimating (SAC) lenses 224a-c are for collimating respective laser beams 240a-c in the slow axis. The angled reflective surfaces 226a-c are for directing retro-reflecting or stray light to a bottom surface 234 of carrier structure 204 so that it can be absorbed and the resultant heat dissipated to a coolant in coolant portion 206. Turning mirrors 230a-c are for directing respective laser beams 240a-c toward P-MUX 236. Turning mirrors 230a-c maybe angled at any of a variety of angles sufficient to direct laser beams 240a-c toward P-MUX 236. P-MUX 236 is configured for directing laser beams 240a-c toward the input surface of fiber 232.

mFAT 222a-c are for telescoping laser beams 240a-c toward the input surface of fiber 232. mFAT 222a-c reduce standard two-element Galilean telescope to a single meniscus lens thereby reducing the number of elements that must be aligned with respect to each other. In another example, standard two-element Galilean telescope lenses may be used instead of the mFAT 222. Light absorbing element 238 is a nonreflective and absorbing material for absorbing residual light that may leak out of P-MUX 236. Fiber ferrule 248 helps to direct laser beams 240a-c into fiber 232.

In an example, laser diodes 222a-c are each disposed on a different stairstep 242, 244 and 246. With this configuration, laser beam 240a is projected over turning mirrors 230b and 230c and laser beam 240b is projected over turning mirror 230c. Laser beams 240a-c are transmitted into PMUX 236. Thus, laser beams 240a-c stack up in the vertical direction in the collimated space with nearly 100% fill factor.

In an example, LSLD pump 200 may be configured with two rows of stair stepped laser beams stacked vertically with one row per polarization using P-MUX 236 to achieve two times the brightness. Laser beams 240a-c are then focused into a fiber using a combination of telescope and focusing lens. Such a stairstep configuration provides a compact and efficient configuration of the laser diodes and optical elements in LSLD pump 200. Each laser beam 240a-c is individually lensed thus enabling beam-pointing that is not possible with bar technology. Bars have inherent "smile" issues which result in "rogue" beams that are not unidirectional, degrade beam quality and introduce high numerical aperture cladding-light when coupled into fibers. This is significantly different from the currently described optical assembly of LSLD pump 200 which can achieve under-filled numerical aperture and spot size when focused into a fiber thus eliminating the need for cooling the delivery fiber. This optical combining method is very efficient and it conserves volume since no large opto-mechanical components are required to arrange the laser beams 240a-c into a compact and nearly 100%-fill-factor collimated beam format—a requirement before focusing for efficient and high brightness operation. This stair-step arrangement provides a simple, multiple-beam compactification method which achieves low volume and clearly distinguishes the disclosed method compared to bar-based coupling scheme.

In an example, one or more rigid support structures 214 are formed along sidewalls 216 of carrier structure 204. Rigid support structures 214 are formed to provide support to the carrier structure 204 to prevent deformation during operation when heating of carrier structure 204 or other housing 202 structures may occur. Deformation due to heating of carrier structure 204 may cause misalignment of optical components described above with respect to FIG. 2B, among other problems. Rigid support structures 214a-c are formed within respective angled sections 215a-c to promote redirection of stray light during operation of LSLD pump 200. A portion of light reflected off of angled sections 215a-c may be absorbed by surfaces 214a-c, 215a-c and 234 and the heat generated by that absorption may be transferred to coolant flowing through the channels described in greater detail with respect to FIGS. 3B and 3C.

Returning to FIG. 2A, housing 202 also may include an inlet 218 and outlet 220 formed in carrier structure 204 of housing 202 for transporting coolant into and out of the channels formed on the backside of carrier structure 204. The channels may be enclosed by bottom segment 206. Such enclosure may be referred to herein as a cooling manifold (shown in more detail in FIG. 5A). Members 108 are disposed within the cooling manifold enabling members 108 to be exposed to coolant without exposing laser diode 101 to the coolant.

Figure 3A:
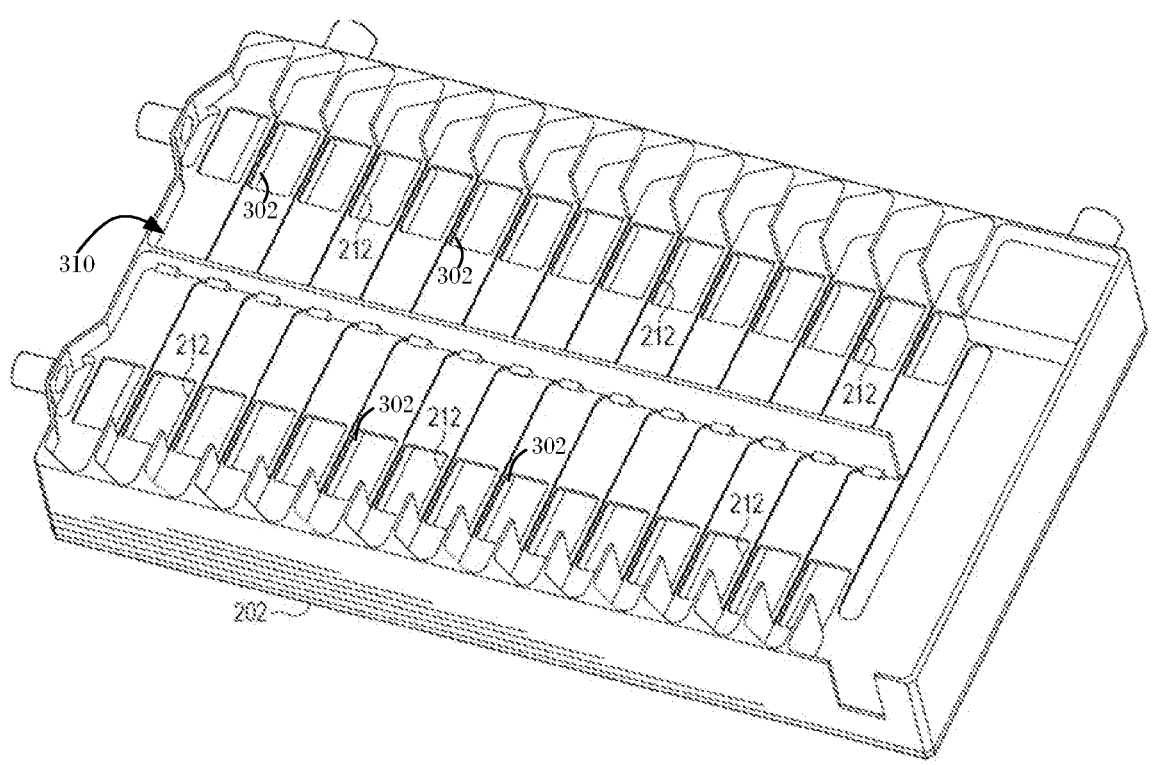
FIG. 3A is a plan view of a front side of an example carrier structure of an LSLD housing.

FIG. 3A illustrates a plan view of a front side 310 of an example carrier structure 204 of housing 202. LSLD assemblies 100 are not shown so that cavities 212 can be more easily visualized. Channel walls 302 disposed on the underside of carrier structure 204 can be seen through cavities 212.

Figure 3B:
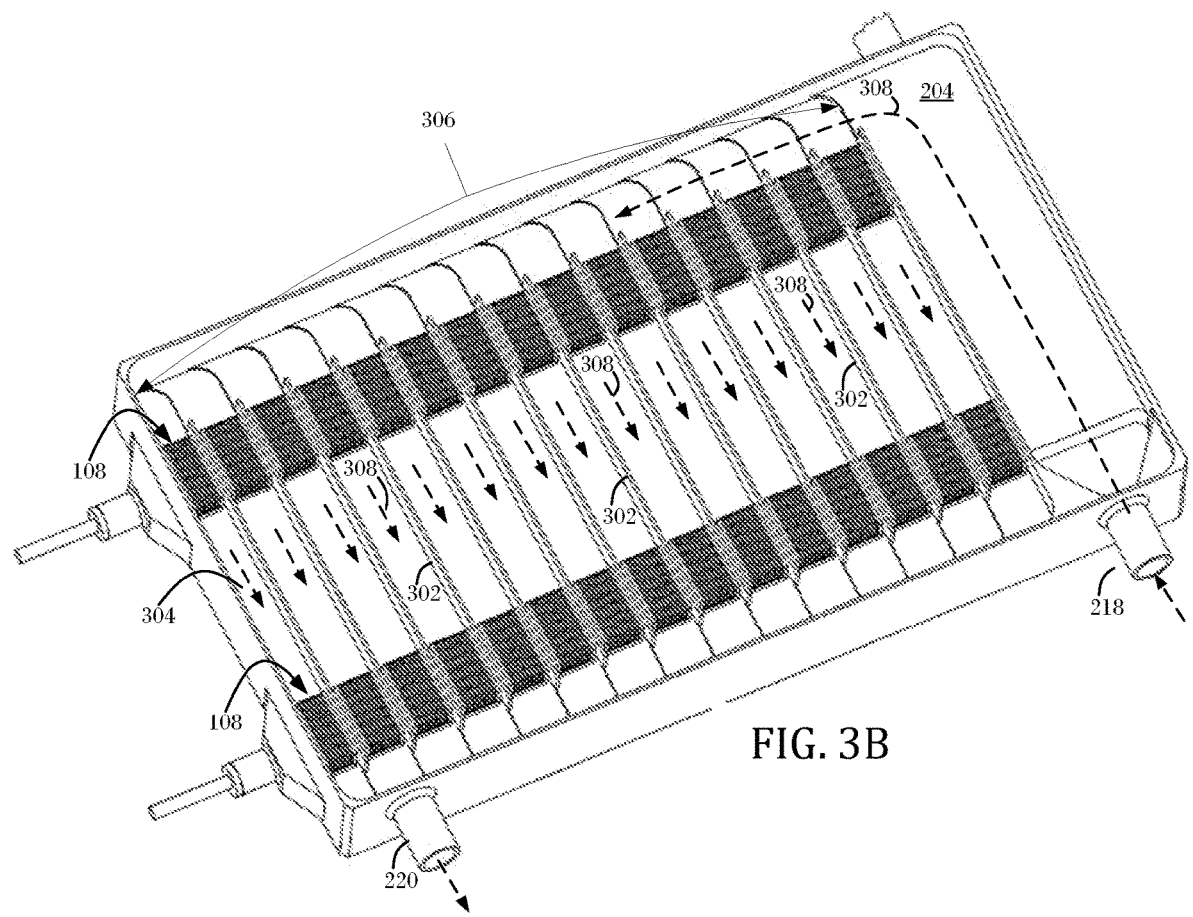
FIG. 3B is a plan view of a backside of an example carrier structure of an LSLD housing.
Figure 3C:
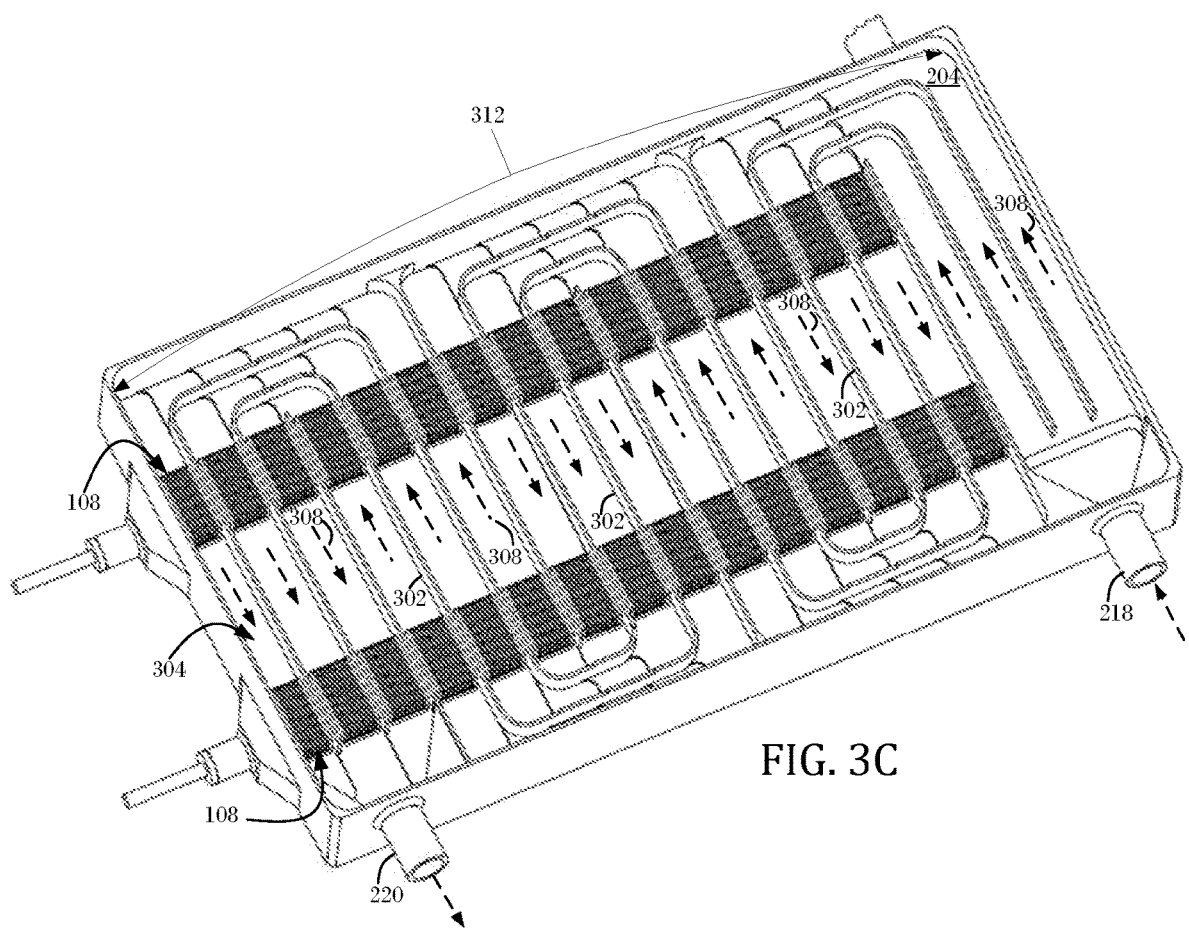
FIG. 3C is a plan view of a backside of an example carrier structure of an LSLD housing.

FIG. 3B illustrates a plan view of a backside 304 of an example carrier structure 204 of housing 202. In an example, one or more channels 306 are configured to guide a coolant across members 108 to transfer heat away from LSLD assembly 100. Bottom segment 206 may form a sealed chamber around channels 306 when coupled with carrier structure 204. Coolant may flow in the direction of arrows 308 from an area of higher pressure to an area of lower pressure for example from inlet 218 to outlet 220. Cooling is reconfigurable to achieve a range of pressure drops and commensurate mass flow rate to maintain desired heat removal capacity and temperature difference across the coolant. Therefore the exact design of the channels 306 is versatile. For example, FIG. 3C shows a channel design wherein channels 306 are configured three across in a serpentine formation from inlet 218 to outlet 220. The materials forming the cooling channels can be coated so that many types of coolants can be used, for example, water, water and either ethylene glycol (EGW) or propylene glycol (PGW), ammonia, or 1,1,1,2-Tetrafluoroethane (R134A), or the like or any combination thereof.

Example Channel Configurations

In table 1 below a number of example channel configurations for 0.9 kg/min/kW are provided. In Table 2 is modeled thermal performance for three examples of channel configurations for LSLD pump 200 using an SiC submount 102 and finned-copper heatsink 104, achieving similar thermal performance at the same water flow rate but under different pressure drop.

TABLE 1

| Power (W)/Pump | No. in Series | ΔP per Pump (PSI) | Total ΔP (PSI) | ΔT per Pump(K) | Total ΔT in Series (K) | MASS FLOW RATE (kg/min/kW) |
|---|---|---|---|---|---|---|
| 360 | 4 | 1.67 | 6.7 | 3.98 | 15.9 | 0.74 |
| 360 | 5 | 1.11 | 5.6 | 2.65 | 13.3 | 0.89 |
| 480 | 4 | 1.67 | 6.7 | 5.30 | 21.2 | 0.55 |
| 480 | 5 | 1.67 | 8.3 | 5.30 | 26.5 | 0.44 |
| 600 | 4 | 1.00 | 4.0 | 3.98 | 15.9 | 0.74 |
| 600 | 5 | 1.00 | 5.0 | 3.98 | 19.9 | 0.59 |

TABLE 2

| Diode Cooling Configuration | Water Temperature Rise (° C.) | Pressure Drop (PSI) | Water Flow Rate (GPM) | Average Diode Temperature (° C.) | Average Thermal Resistance (° C./W) |
|---|---|---|---|---|---|
| 15 in parallel 2 in series | 7.0 | 0.08 | 0.21 | 30 | 1.1 |
| 5 in parallel 6 in series | 7.0 | 0.88 | 0.21 | 29 | 1.1 |
| 3 in parallel 10 in series | 7.0 | 2.67 | 0.21 | 28 | 1.0 |

Figure 4A:
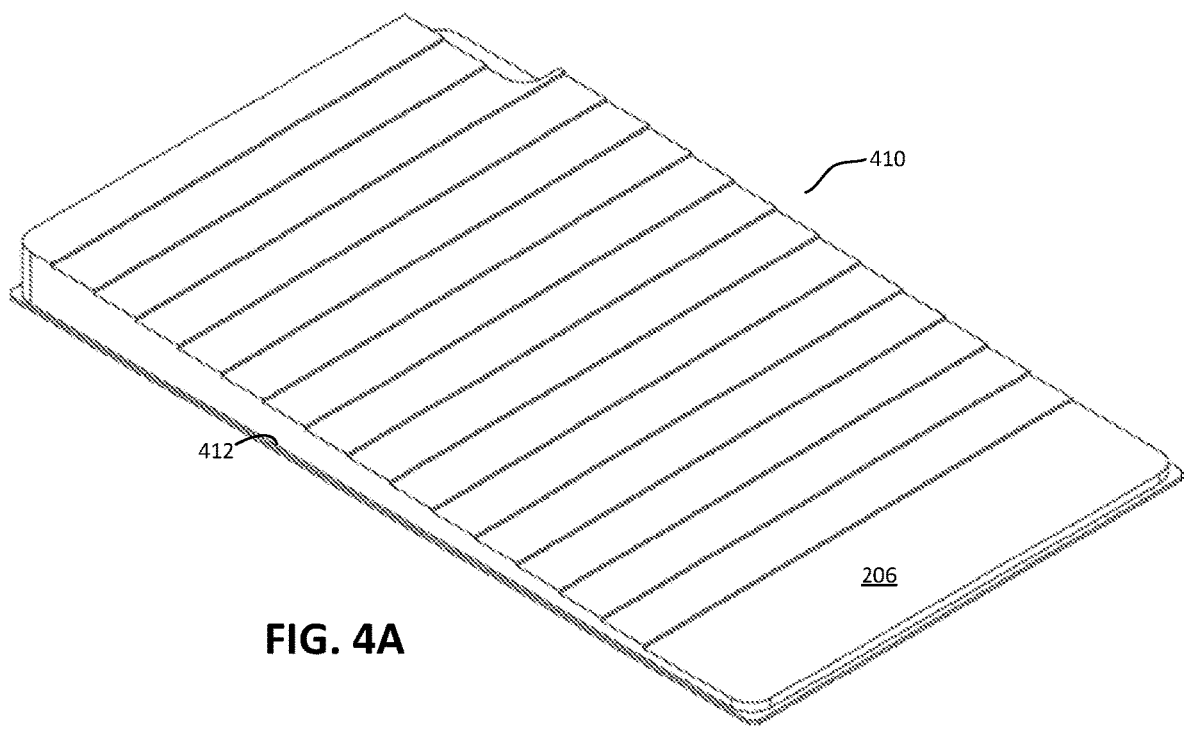
FIG. 4A is a perspective view of a top side of an example of a bottom segment of an LSLD housing.

FIG. 4A illustrates a perspective view of topside 410 of an example bottom segment 206. In an example, bottom segment 206 has a staircase shape that is similar to the staircase shape of carrier structure 204. In other examples bottom segment 206 may have different conformations depending on the particular design of LSLD pump 200. Bottom segment 206 is configured to mate to carrier structure 204 fitting inside of carrier structure 204 with lip 412 extending around a bottom edge of carrier structure 204.

Figure 4B:
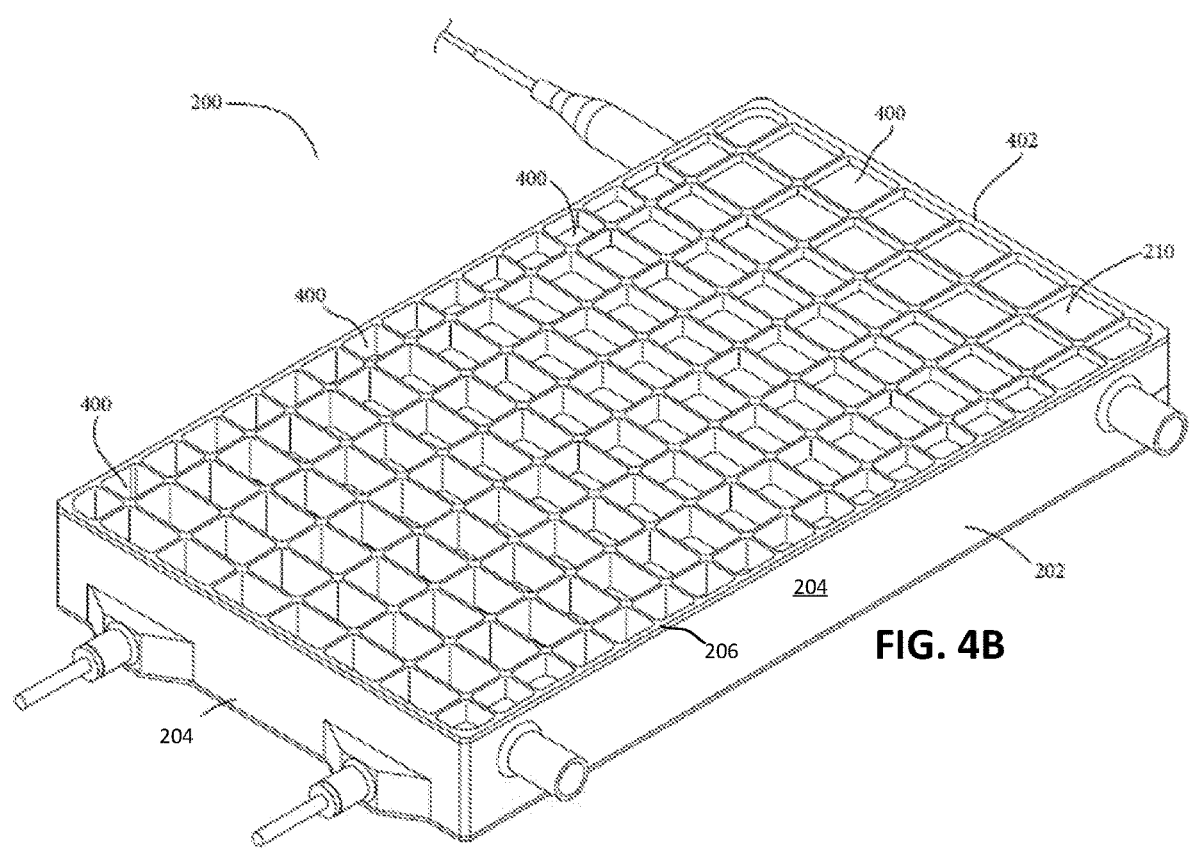
FIG. 4B is a perspective view of an example of a backside of a bottom segment fitted to carrier structure of housing 202.

FIG. 4B illustrates a perspective view of an example of a backside 402 of bottom segment 206 fitted to carrier structure 204 of housing 202. Backside 402 has one or more voids 400 formed by a variety of methods known to those of skill in the art such as machining, chemical etching, 3D manufacturing, forging, die-casting or the like or combinations thereof. The voids 400 are formed to reduce the weight of LSLD pump 200 while providing structural support to housing 202 in order to prevent deformation of bottom segment 206 and/or other portions of housing 202. Such deformation may have devastating effects on critical optical alignments, for example, of the laser diode 101 with various optical components precisely positioned within housing 202 as described above with respect to FIG. 2B.

The voids 400 may be of a variety of shapes and sizes. In some examples, voids 400 may be hexagonal and arranged in a honeycomb or may be square and arranged in a grid as depicted in FIG. 4B. In other examples, the one or more voids 400 may comprise any of a variety of geometrical shapes standing alone, tiled or otherwise arranged together to optimize stiffness for lowest mass. Tiling may be done in a regular repeating pattern or in an aperiodic pattern. In an example, the shape(s) of the one or more voids 400 may be selected to optimize structural support and/or weight or volume reduction of housing 202. Because bottom segment 206 has a staircase shape as shown in FIG. 4A, the depth of voids 400 is shallower where the stairstep height is lower and as the stairstep height increases so too does the depth of voids 400. In another example, bottom segment 206 may be flat and the one or more voids 400 may be the same or similar depths.

Figure 5A:
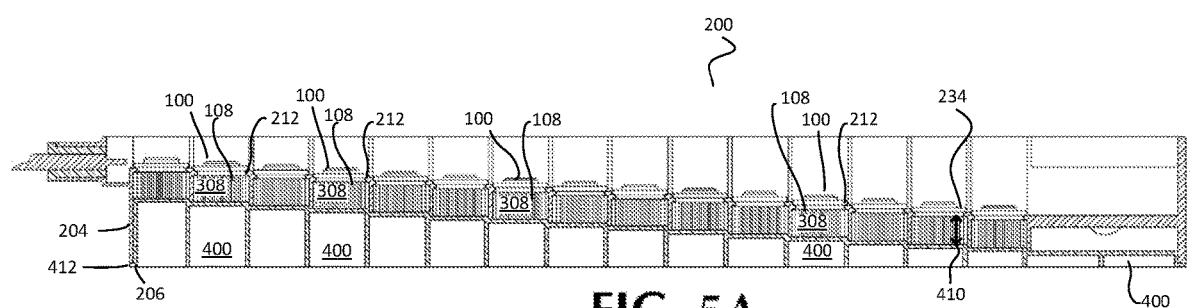
FIG. 5A is a cross-sectional side view of an example LSLD pump.

FIG. 5A is a longitudinal cross-sectional side view of LSLD pump 200. In an example, LSLD assemblies 100 are disposed in apertures 212 of carrier structure 204. Members 108 extend into channels 306 which are enclosed by top surface 410 of bottom segment 206. Bottom segment 206 is configured to mate to carrier structure 204 fitting inside of carrier structure 204 with lip 412 extending around a bottom edge of carrier structure 204. The assembly of carrier structure 204 and bottom segment 206 may be a tight fit sufficient to create a seal and/or barrier to leakage of coolant out of channels 306. Top surface 410 may be coupled to carrier structure 204 by a variety of methods for example by a close fit, welding, brazing, soldering and the like or any combinations thereof. Channel 306 heights are defined by the distance between surface 234 of carrier structure 204 and top surface 410 of bottom segment 206. Thus, channel 306 heights are substantially uniform. Voids 400 have varying heights/volumes depending on the height of a corresponding stair step.

Figure 5B:
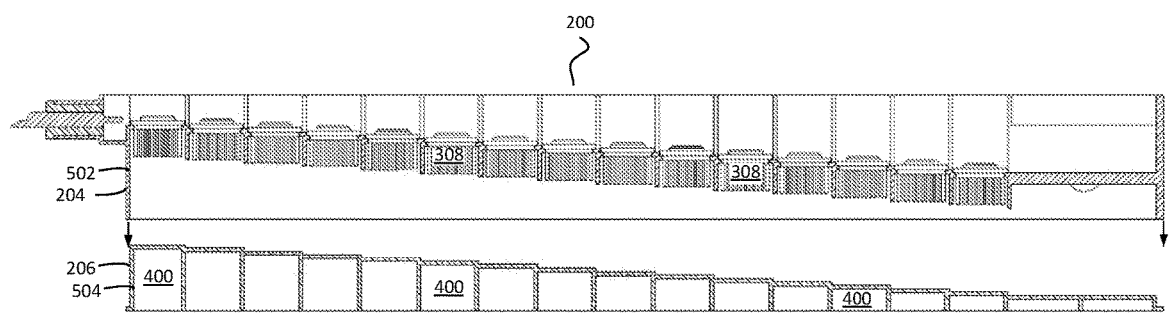
FIG. 5B is an exploded cross-sectional side view of an example LSLD pump 200.

FIG. 5B is an exploded longitudinal cross-sectional side view of LSLD pump 200. In an example, carrier structure 204 wall 502 is configured to fit snugly around bottom segment 206 wall 504. Coupling of wall 502 with wall 504 may create a seal sufficient to prevent coolant leakage from channels 306. Again, as noted above carrier structure 204 may be coupled to bottom segment 206 by a variety of methods including friction, welding, brazing, soldering, laser welding, seam-sealing or the like, or any combination thereof. In an example, LSLD pump 200 may achieve 0.5 kg/kW specific mass.

FIG. 6 is an exploded cross-sectional side view of LSLD pump 200. In an example, LSLD assembly 100 is disposed in aperture 212. Heatsink 104 rests on lip 602 of aperture 212 such that members 108 extend into channel 306. Channels 306 are defined by channel walls 302.

Figure 7:
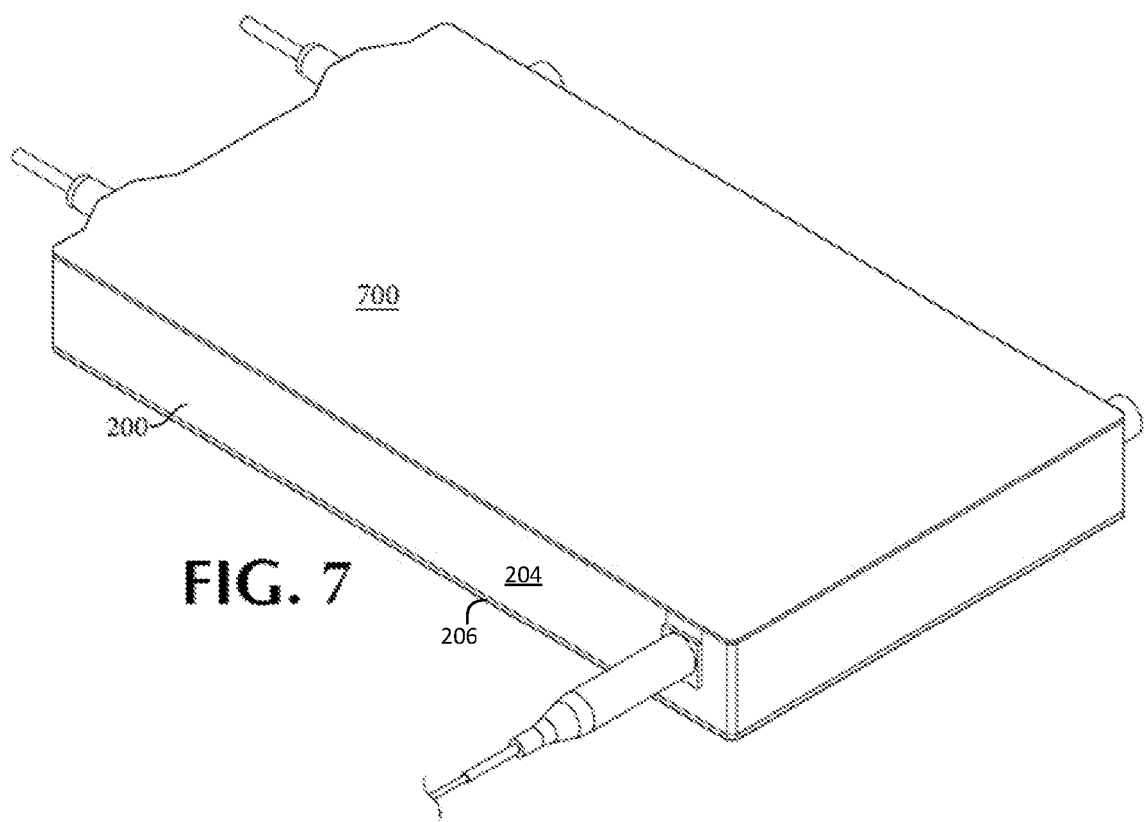
FIG. 7 is a perspective view of an example of an LSLD pump having a lid.

FIG. 7 illustrates an example of a LSLD pump 200 having a lid 700 for enclosing the LSLD pump 200 system. Lid 700 is a thermally noncritical part and may comprise low-density material.

Topological Optimization of Heatsink

Figure 8:
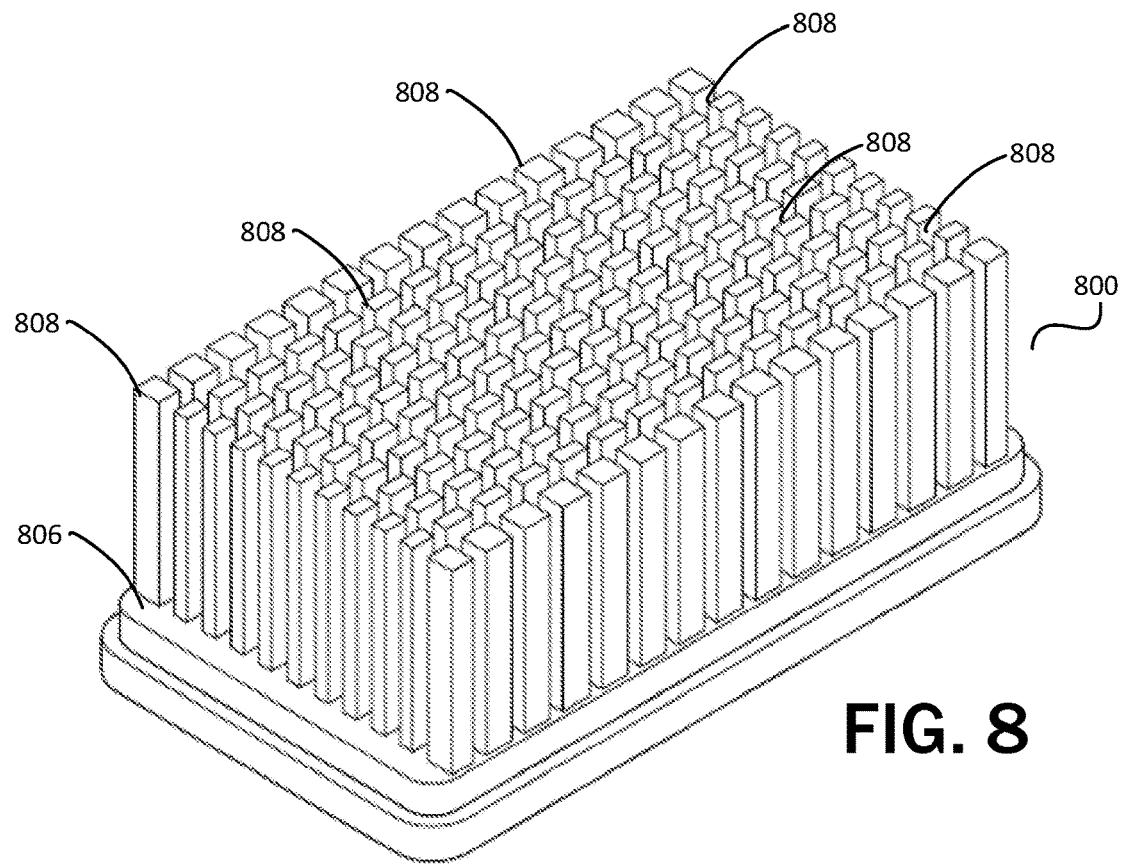
FIG. 8 illustrates an example of a specialized heatsink for an LSLD pump.

FIG. 8 illustrates an example of a specialized heatsink 806 for LSLD assembly 800 for implementation in LSLD pump 200. In an example, heatsink 806 may be made from a variety of thermally conductive materials such as AlSiC, AlBe, pyrolytic graphite, annealed pyrolytic graphite (APG), encapsulated APG, Cu, Al, Si or the like or any combinations thereof. Members 808 may comprise pegs or posts having a high surface area-to-volume ratio to enable removal of excess heat from a laser diode/submount assembly (not shown) as discussed above. The pegs or posts may be any of a variety of shapes such as square, rectangular, polygonal or circular or the like or any combination thereof. This configuration may further reduce the weight of the LSLD pump 200 and increase the thermal transfer coefficient over fin shaped members 108. In this way, the thermal performance may be further improved and weight reduced.

Figure 9A:
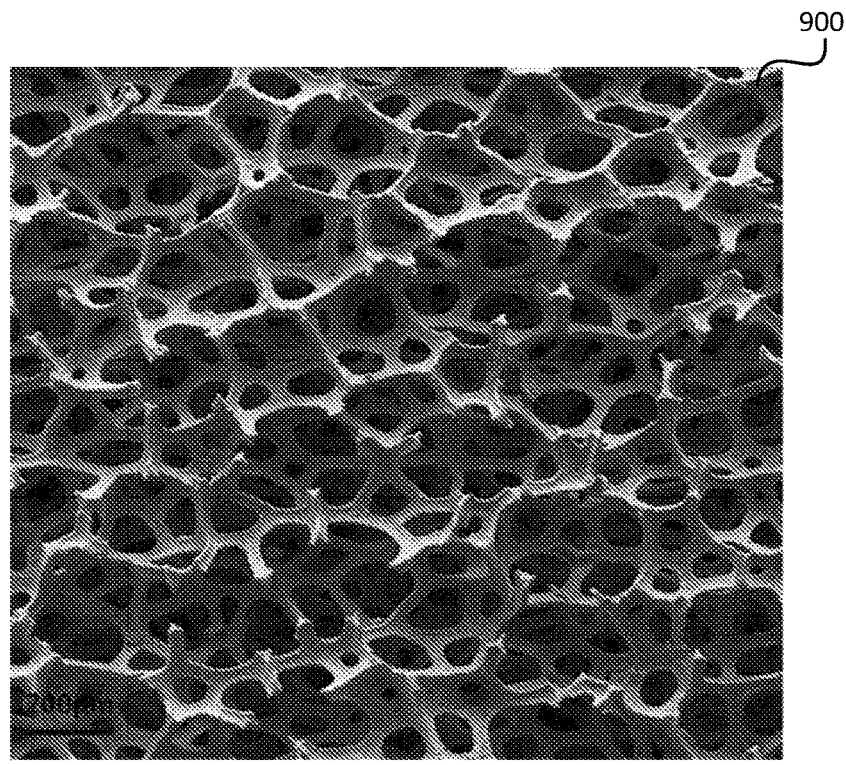
FIG. 9A illustrates an example of a specialized heatsink for an LSLD pump.

FIG. 9A depicts an example heatsink 806 (see FIG. 8) material for increasing surface area to come into contact with a coolant for cooling LSLD pump 200. Graphite foam 900 is a lightweight structure with high thermal conductivity. In an example, heatsink 806 and/or members 808 may comprise graphite foam 900. The graphite foam 900 may be coupled to submount 102 by brazing, soldering, laser welding, or the like or any combination thereof.

Figure 9B:
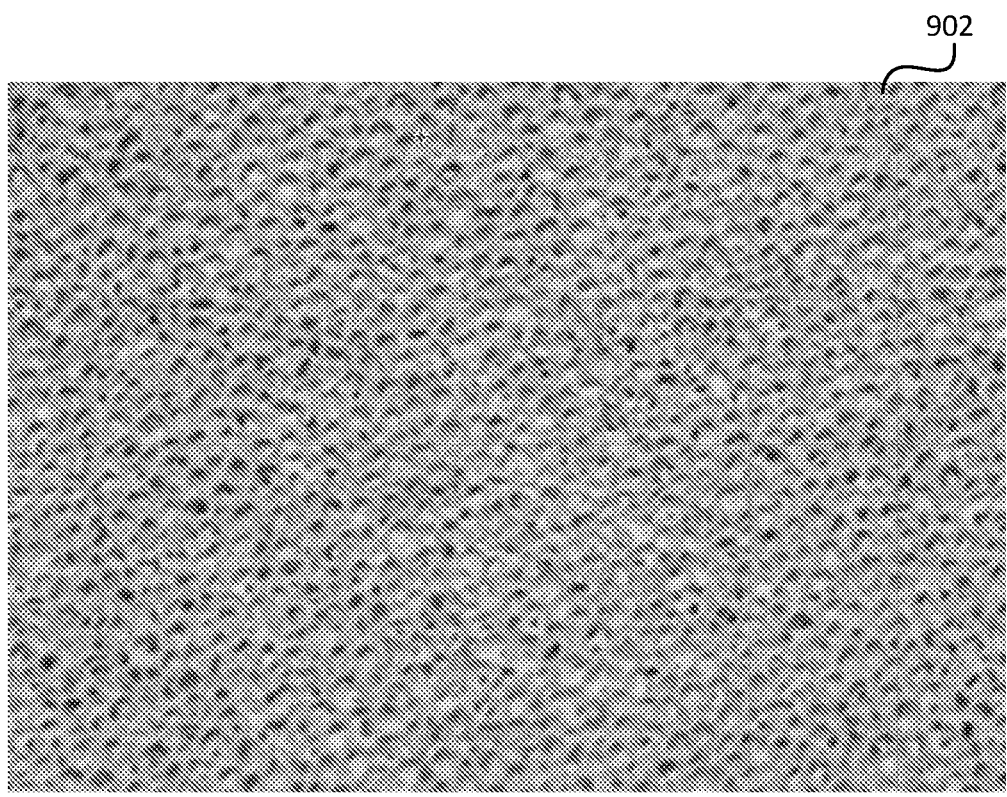
FIG. 9B illustrates an example of a specialized heatsink material for an LSLD pump.

FIG. 9B depicts an example heatsink 806 material for increasing surface area to come into contact with a coolant for cooling LSLD pump 200. Microporous copper 902 is lightweight with 80% porosity, has high thermal performance, and requires little processing in order to prepare it for use. Heatsink 104 and/or members 108 may comprise microporous Cu 902. The microporous Cu 902 may be coupled to submount 102 by brazing, soldering, laser welding, or the like or any combinations thereof.

Figure 9C:
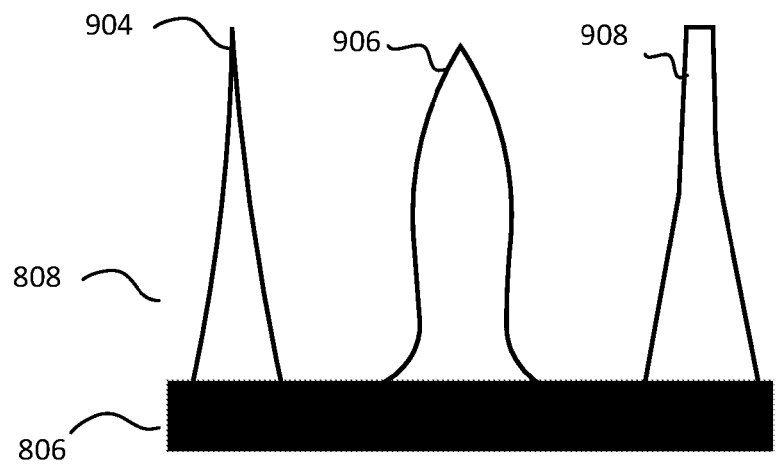
FIG. 9C illustrates an example of specialized heatsink members for an LSLD pump

FIG. 9C depicts example members 808 of heatsink 806 comprising various shapes. In an example, members 808 may comprise an elongated wedge 904, a parabolic cone 906 and/or a bottleneck 908 that may improve thermal transfer by increasing surface-area-to-volume ratio, turbulent flow and/or promote more complete transfer of heat throughout a coolant in close proximity with the members 108. Members 808 may take on any one of the shapes 904, 906, or 908 or may have a variety of shapes on a single heatsink including 904, 906 and/or 908 in heatsink 104. However, these are merely examples, many other shapes may be configured to optimize the variables noted above and claimed subject matter is not limited in this regard.

Figure 9D:
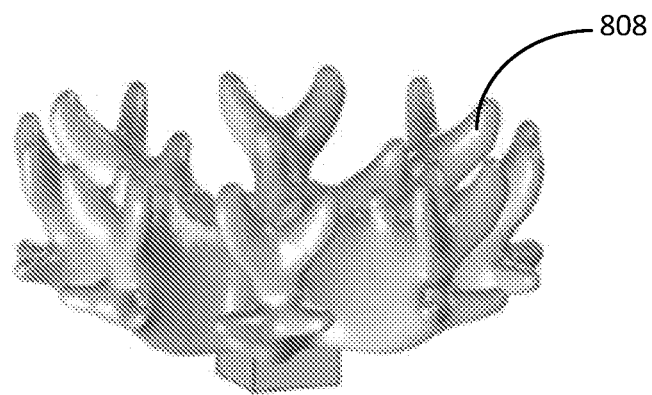
FIG. 9D illustrates an example of a specialized heatsink for an LSLD pump.

FIG. 9D depicts example members 808 formed using computer modeling and 3D manufacturing techniques. Such computer modeling techniques may be able to identify a "3D topologically optimized structure" for a particular laser power, coolant substance, and/or laser diode pump architecture. Modeling enables optimizing thermal transfer by identifying structures to increase surface-area-to-volume ratio, turbulent flow and/or promote more complete transfer of heat throughout a coolant, as well as other factors promoting thermal transfer. In an example, members 808 may be formed by micro-machining or 3D manufacturing silicon or other materials known to those of skill in the art. Silicon is less costly than copper and fabrication of 3D structures in silicon is also relatively easier compared to machining copper since silicon can be micro-machined at a wafer-level.

Cooling Manifold

Figure 10A:
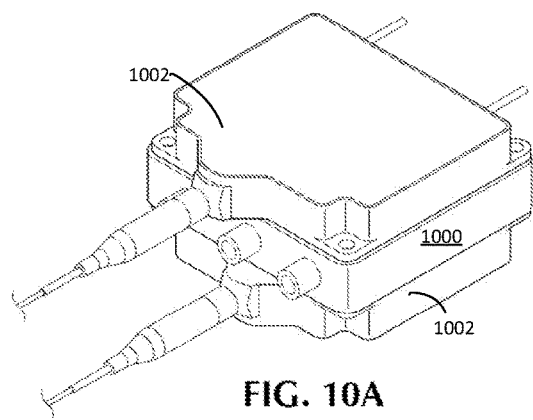
FIG. 10A is a perspective view of an example of a plurality of LSLD pumps coupled to a manifold configured to enable the LSLD pumps to be arranged in a compact layout.
Figure 10B:
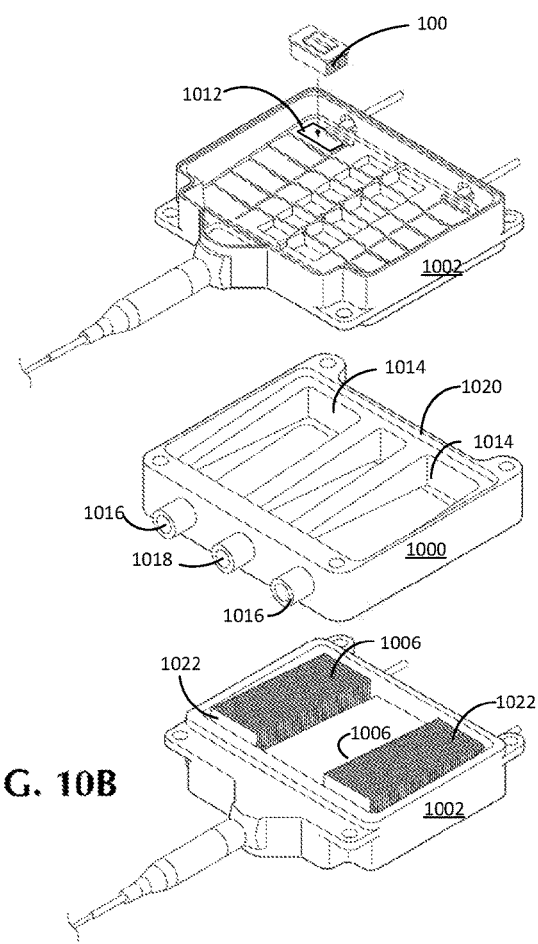
FIG. 10B is an exploded view of an example of a plurality of LSLD pumps coupled to a manifold configured to enable the LSLD pumps to be arranged in a compact layout.
Figure 10C:
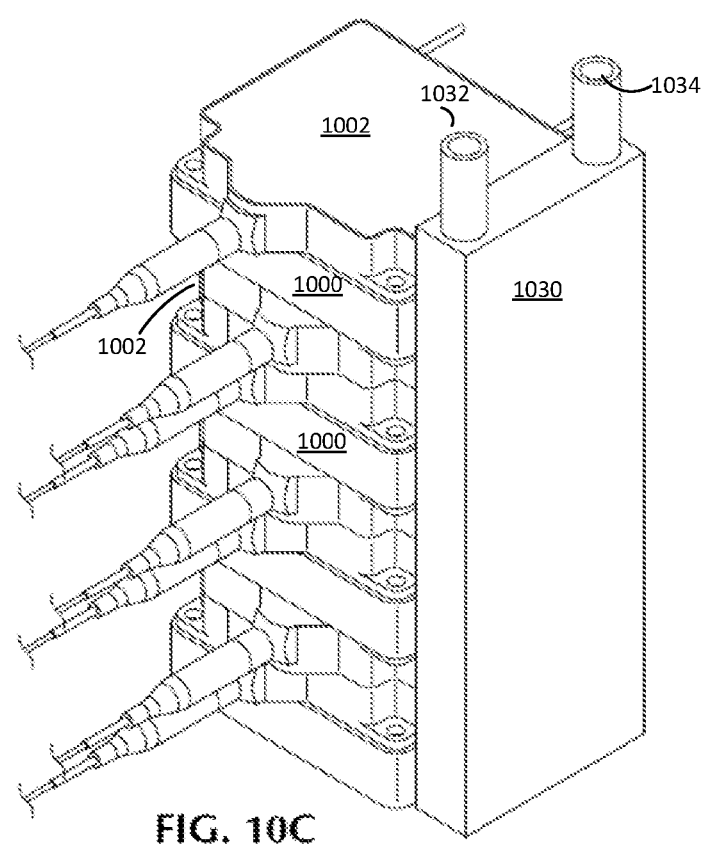
FIG. 10C is a perspective view of an example of a plurality of LSLD pumps layered with intervening manifold and shared coolant source to enable the LSLD pumps to be arranged in a compact layout.

FIGS. 10A-10C depict examples of a plurality of LSLD pumps sharing one or more cooling manifold 1000.

FIG. 10A depicts an example manifold 1000 coupled between two LSLD pumps 1002. LSLD pumps 1002 are similar to LSLD pumps 200 described above, however in this example, LSLD pumps 1002 have a 2×6 arrangement of LSLD assemblies 100. In an example, manifold 1000 may comprise lightweight material, for example PEEK, plastic, polypropylene, glass, fiber-glass, or the like or any combinations thereof. Manifold 1000 may be used to introduce coolant to remove excess heat dissipated by the heatsinks 1006 (see FIG. 10B) of both LSLD pumps 1002. Heatsinks 1006 are similar to heatsinks 104 described above with respect to FIG. 1. Including a manifold 1000 reduces the need for a chilling plate or other additional heat transfer devices which typically add excess mass and volume to laser diode pump systems. Manifold 1000 can be designed in numerous different configurations depending on the available volume allocation and the shape of the volume for multi-kilowatt systems.

FIG. 10B is an exploded view of LSLD pumps 1002 and manifold 1000. One of the LSLD assemblies 100 and apertures 1012 are visible in upper LSLD pump 1002. Manifold 1000 has channels 1014 sized to permit alignment with members 1022 (e.g., fins or the like as described above) of heatsinks 1006 for directing coolant around and through the structural features of members 1022. As described above, members 1022 may be any of a variety of shapes, materials, and/or 3D structures as discussed hereinabove. In the current example members 1022 are fins. Inlet ports 1016 and outlet port 1018 supply coolant to the channels 1014. In another example, and depending on the needs of application inlet ports 1016 and outlet port 1018 may be reversed wherein ports 1016 may be the outlet ports and port 1018 may be the inlet port.

Another strategy is to stack multiple LSLD pumps 1002 and manifold 1000 one on top of the other. FIG. 10C is a perspective view of an example of a plurality of LSLD pumps layered with intervening manifold 1000 and common manifold 1030 to enable the LSLD pumps 1002 to be arranged in a compact layout. This type of packing configuration is useful for applications where available space is very tight. In this particular configuration, with a 150 W output per LSLD pump 1002, a total of 2100 W can be generated in a total volume of 1355 $cm^3$ resulting in ~1.55 $W/cm^3$. These high brightness diodes can be combined using a commercial 7×1 fiber-combiner to produce ~1 kW output from a 220 µm and 0.22 NA beam. Then using a 6+1:1 combiner, a total of 6 kW of pump can be deployed into a 400 µm and 0.46 NA DC fiber amplifier to produce 5 kW of single mode output. There are yet other configurations that can be invoked to befit a particular volume size and shape requirement.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

The invention claimed is:

1. A device comprising:
   a Low Size Weight Power Efficient (SWAP) Laser Diode (LSLD) assembly, including:
   a housing assembly, comprising:
      an enclosure;
      a carrier structure comprising a plurality of coolant channels disposed within the enclosure; and
      a plurality of laser diodes in contact with respective ones of a plurality of heatsinks, wherein the heatsinks comprise cooling members that extend into the enclosure and are disposed within respective coolant channels of the plurality of coolant channels configured to direct a flow of a coolant within the cooling channels.

2. The device of claim 1, wherein the plurality of coolant channels are inline and configured to cause a coolant to flow in a single direction across the plurality of heatsinks.

3. The device of claim 1, wherein the plurality of coolant channels are configured to follow a serpentine path and to cause a coolant to flow across at least two different heatsink members in opposite directions.

4. The device of claim 1, further comprising a bottom segment configured to couple to the carrier structure to form the enclosure.

5. The device of claim 4, wherein the bottom segment comprises at least one void outside of the enclosure.

6. The device of claim 5, wherein the bottom segment comprises a plurality of voids outside of the enclosure, wherein the voids are rectangular and form a grid.

7. The device of claim 6, wherein the bottom segment comprises a plurality of voids outside of the enclosure, wherein the voids are of various depths.

8. The device of claim 4, wherein the carrier structure or the bottom segment are stepped, or a combination thereof.

9. The device of claim 1, wherein the cooling members comprise a plurality of fins.

10. The device of claim 1, wherein the cooling members comprise a microporous copper structure.

11. The device of claim 1, wherein the cooling members comprise a graphite foam.

12. The device of claim 1, wherein the cooling members comprise posts.

13. The device of claim 1, wherein cooling members comprise a three-dimensional structure optimized for surface area to volume, turbulent flow and thermal transfer throughout the coolant.

14. The device of claim 1, wherein the coolant comprises water, water and ethylene glycol (EGW), water and propylene glycol (PGW), ammonia, or 1,1,1,2-Tetrafluoroethane (R134A) or any combination thereof.

15. The device of claim 1, wherein the plurality of heatsinks comprises aluminum silicon carbide (AlSiC), pyrolytic graphite, annealed pyrolytic graphite (APG), encapsulated APG, copper (Cu), aluminum (Al), or any combination thereof.

16. The device of claim 1, wherein the plurality of heatsinks are coupled to respective submounts of a plurality of submounts, respective cooling members are formed on a side opposite the respective coupled submount, and the plurality of submounts comprise silicon carbide (SiC), chemical vapor deposition (CVD) diamond, copper (Cu), aluminum nitride (AlN), cubic boron nitride (c-BN), graphite, graphene, graphene-composites, carbon nanotubes, carbon nanotube composites, diamond, diamond composites or pyrolytic graphite or any combination thereof.

17. The device of claim 16, wherein at least one of the plurality of submounts comprise a first thermally conductive material, at least one of the plurality of heatsinks comprise a second thermally conductive material and the first thermally conductive material and the second thermally conductive material are different.

18. A laser pump assembly, comprising:
   a plurality of LSLD pumps each comprising a plurality of laser diodes in contact with respective ones of a plurality of heatsinks, wherein each heatsink comprises cooling members extending into a respective coolant channel of a plurality of coolant channels disposed in a common manifold wherein at least two LSLD pumps share the common manifold.

* * * * *